(12) United States Patent
Yamazaki et al.

(10) Patent No.: US 7,133,731 B2
(45) Date of Patent: Nov. 7, 2006

(54) COMPONENT MOUNTING SEQUENCE OPTIMIZING METHOD, COMPONENT MOUNTING DEVICE, PROGRAM FOR EXECUTING COMPONENT MOUNTING SEQUENCE OPTIMIZING METHOD, AND RECORDING MEDIUM IN WHICH THE PROGRAM IS RECORDED

(75) Inventors: Takuya Yamazaki, Tosu (JP); Yasuhiro Maenishi, Kofu (JP); Ikuo Yoshida, Uji (JP); Akihito Yamasaki, Kurume (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/533,436

(22) PCT Filed: May 25, 2004

(86) PCT No.: PCT/JP2004/007441

§ 371 (c)(1),
(2), (4) Date: May 2, 2005

(87) PCT Pub. No.: WO2004/107838

PCT Pub. Date: Dec. 9, 2004

(65) Prior Publication Data

US 2005/0288806 A1    Dec. 29, 2005

(30) Foreign Application Priority Data

May 27, 2003    (JP)    ............................. 2003-148790

(51) Int. Cl.
*G06F 19/00* (2006.01)
(52) U.S. Cl. ..................... 700/95; 700/97; 700/101
(58) Field of Classification Search ............. 700/95, 700/97, 101, 121; 29/740, 743
See application file for complete search history.

(56) References Cited

U.S. PATENT DOCUMENTS

| | | | | |
|---|---|---|---|---|
| 5,862,586 A | * | 1/1999 | Kimura | 29/832 |
| 6,260,178 B1 | * | 7/2001 | Schaffer | 716/2 |
| 6,356,352 B1 | * | 3/2002 | Sumi et al. | 356/614 |
| 6,860,002 B1 | * | 3/2005 | Oyama | 29/740 |
| 6,973,713 B1 | * | 12/2005 | Huber et al. | 29/740 |
| 2006/0022019 A1 | * | 2/2006 | Terada et al. | 228/105 |

FOREIGN PATENT DOCUMENTS

| | | |
|---|---|---|
| JP | 2002-171097 | 6/2002 |
| WO | 00/67542 | 11/2000 |
| WO | 02/13590 | 2/2002 |

* cited by examiner

*Primary Examiner*—Leo Picard
*Assistant Examiner*—Alexander Kosowski
(74) *Attorney, Agent, or Firm*—Wenderoth, Lind & Ponack, L.L.P.

(57) ABSTRACT

The present invention provides a component mounting sequence optimizing method, a component mounting device, a program for executing the component mounting sequence optimizing method, and recording medium in which the program is recorded, in the component mounting device with a component holding head capable of holding a plurality of components and having a component recognition camera. The invention includes a component mounting sequence optimizing device and a mounting sequence for components is determined on basis of a result of comparison between conveyance times for the components and recognition times required for recognitions of the components. Thus cycle time for mounting can be reduced, in comparison with conventional arts, in mounting of components with a component holding head having a plurality of component holding members and having a component recognition camera.

9 Claims, 11 Drawing Sheets

MOUNTING POINT pi = (COMPONENT TYPE ci, X COORDINATE xi, Y COORDINATE yi, CONTROL DATA $\phi i$)

NC DATA IS LIST OF MOUNTING POINTS pi $$NC\ DATA = \begin{pmatrix} p1 \\ p2 \\ p3 \\ \vdots \\ pN \end{pmatrix} = \begin{pmatrix} c1, x1, y1, \phi 1 \\ c2, x2, y2, \phi 2 \\ c3, x3, y3, \phi 3 \\ \vdots \\ cN, xN, yN, \phi N \end{pmatrix}$$

| COMPONENT NAME | (COMPONENT APPEARANCE) | COMPONENT SIZE (mm) X | Y | L | TWO-DIMENSIONAL RECOGNITION METHOD | SUCTION NOZZLE | PROCESSING TIME (SEC) | SPEED XY |
|---|---|---|---|---|---|---|---|---|
| 0603CR |  | 0.6 | 0.3 | 0.25 | | SX | 0.086 | |
| 1005CR | | 1.0 | 0.5 | 0.3-0.5 | | SA | 0.094 | 1 |
| 1608CR |  | 1.6 | 0.8 | 0.4-0.8 | | S | | |
| 2012CR | | 2.0 | 1.25 | 0.4-0.8 | | | 0.11 | |
| 3216CR | | 3.2 | 1.6 | 0.4-0.8 | | | | |
| 4TR |  | 2.8 | 2.8 | 1.1 | | | | |
| 6TR |  | 4.3 | 4.5 | 1.5 | | | | |
| 1TIP |  | 2.0 | φ1.0 | — | | CYLINDRICAL TIP | | |
| 2TIP | | 3.6 | φ1.4 | — | | | | |
| 1CAP |  | 3.8 | 1.9 | 1.6 | REFLECTION | S | | |
| 2CAP | | 4.7 | 2.6 | 2.1 | | | | |
| 3CAP | | 6.0 | 3.2 | 2.5 | | | | |
| 4CAP | | 7.3 | 4.3 | 2.8 | | | | |
| SCAP |  | 4.3 | 4.3 | 6.0 | | M | | |
| LCAP | | 6.6 | 6.6 | 6.0 | | | | |
| LLCAP | | 10.3 | 10.3 | 10.5 | | ML | | |
| 1VOL |  | 4.5 | 3.8 | 1.6-2.4 | | | 0.13 | 2 |
| 2VOL | | 3.7 | 3.0 | 1.6 | | M | | |
| 3VOL | | 4.8 | 4.0 | 3.0 | | | | |

COMPONENT RECOGNITION SEQUENCE →

COMPONENT MOUNTING SEQUENCE OPTIMIZING METHOD, COMPONENT MOUNTING DEVICE, PROGRAM FOR EXECUTING COMPONENT MOUNTING SEQUENCE OPTIMIZING METHOD, AND RECORDING MEDIUM IN WHICH THE PROGRAM IS RECORDED

TECHNICAL FIELD

The present invention relates to a component mounting sequence optimizing method for determining an optimal sequence in which components such as electronic components are mounted on a board such as a printed circuit board by a component mounting machine, a component mounting device for executing the component mounting sequence optimizing method, a program for making a computer execute the component mounting sequence optimizing method, and a recording medium in which the program is recorded and which can be read by computers. More particularly, the component mounting sequence optimizing method is a method for optimizing a component mounting sequence that can be executed, especially, in a component mounting device having a working head for holding a plurality of components and mounting the components on a board, the working head having a camera for component recognition and being capable of performing conveyance to component mounting positions and component recognition in one step.

BACKGROUND ART

In component mounting machines for mounting electronic components on boards such as printed circuit boards, a sequence of mounting of object components is optimized for achieving shorter processing time (mounting time). Methods of the optimization often differ with specifications of component mounting machines; however, component mounting machines having a highly productive multiple placement head for sucking a plurality of components in a sucking step and mounting the components on a board have recently been developed due to a steep increase in demand for electronic equipment such as portable telephones and notebook PCs, and new methods of optimizing component mounting sequence that correspond to such high-function component mounting machines have been demanded.

Among conventional arts for such a purpose is a component mounting sequence optimizing method that improves an efficiency of suction of a multiple placement head capable of simultaneously sucking a plurality of components and that minimizes a moving amount of the multiple placement head (see Japanese unexamined patent application No. 2002-171097, for example). In accordance with the optimizing method, optimization of a component mounting sequence can be achieved that is suitable for the component mounting machine having the highly productive multiple placement head.

Flow from suction to mounting of components in the component mounting machine in the component mounting sequence optimizing method will be described with reference to a flowchart of FIG. 11. In a step S1, a plurality of components are sucked by the multiple placement head from component feeding sections. In a next step S2, the components sucked in the step S1 are conveyed to a recognition section and are then recognized. In a next step S3, one of the sucked components is conveyed to a mounting position. In a next step S4, the component conveyed to the mounting position in the step S3 is mounted onto a board. In a next step S5, a number of components still sucked on the multiple placement head is determined, and the step S3 and the step S4 are then repeated until all the sucked components are mounted. Herein, the step S1 will be referred to as a suction operation, and the step S2 as a recognition operation, the step S3 and the step S4 together as a mounting operation.

Figure 11:
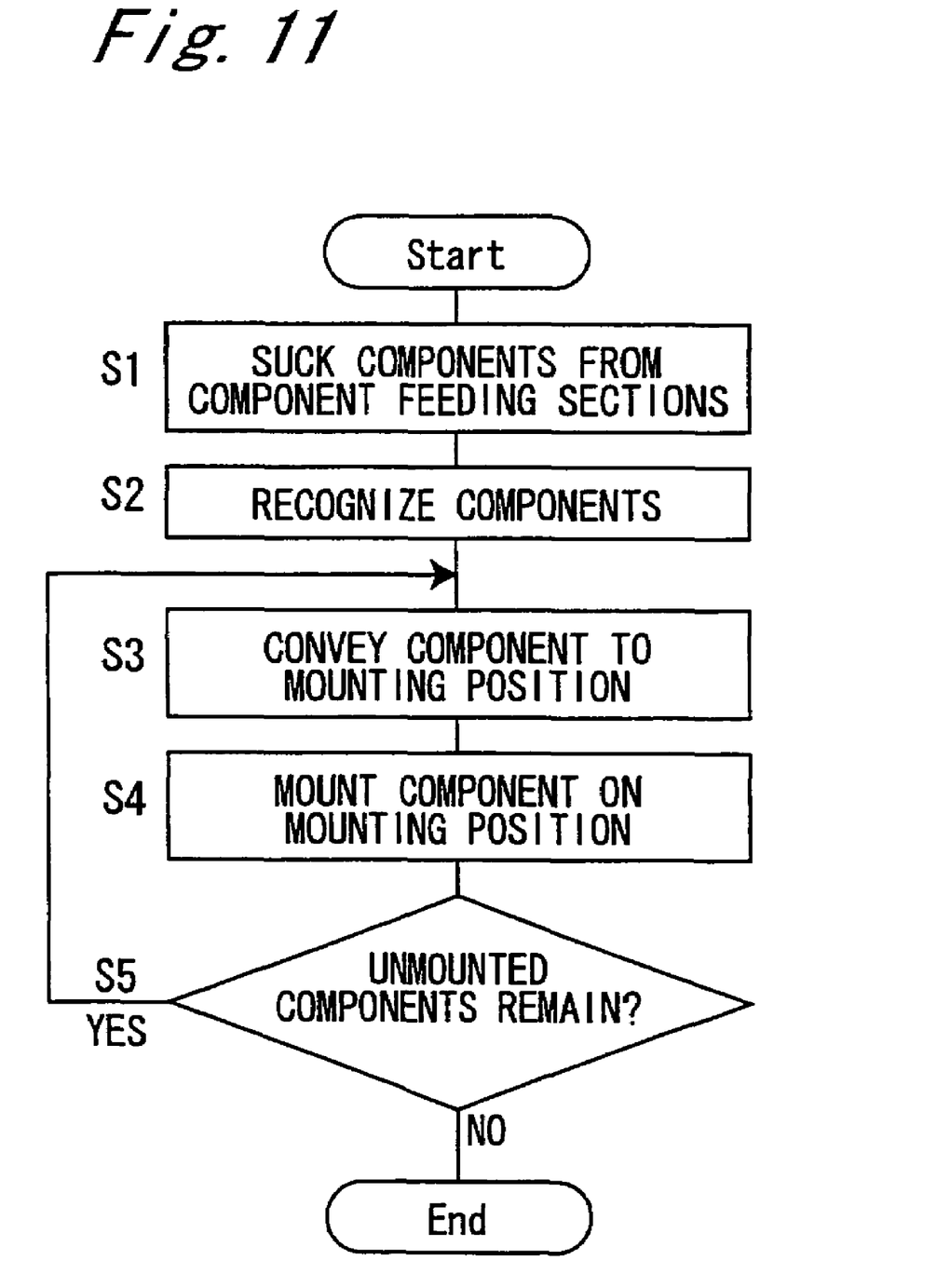
FIG. 11 is a flowchart showing a conventional component mounting procedure.

Since the operations of suction, recognition, and mounting are independent of one another as apparent from FIG. 11, and completion of the last operation precedes initiation of the next operation, a processing time can be therefore determined as a total length of time required for each of the operations. As for the mounting operation, the processing time is determined by a travel of the multiple placement head in the repetition of the conveyance to the mounting points and the mounting operation. In the conventional art, therefore, a component mounting sequence is determined so as to minimize the moving amount of the multiple placement head.

Herein, the "processing time" refers to a total time required for mounting of object components.

In the above conventional optimizing method, however, the recognition section for recognizing sucked components is provided separately from the multiple placement head as described above, and no consideration is given to a structure in which a head camera for component recognition is installed on the multiple placement head so as to allow conveyance and recognition of components to be performed in one step. Therefore, application of the conventional optimizing method described above to a component mounting machine in which the head camera is installed disables the characteristic of the head camera that allows the conveyance and recognition of components to be performed in one step.

Figure 12:
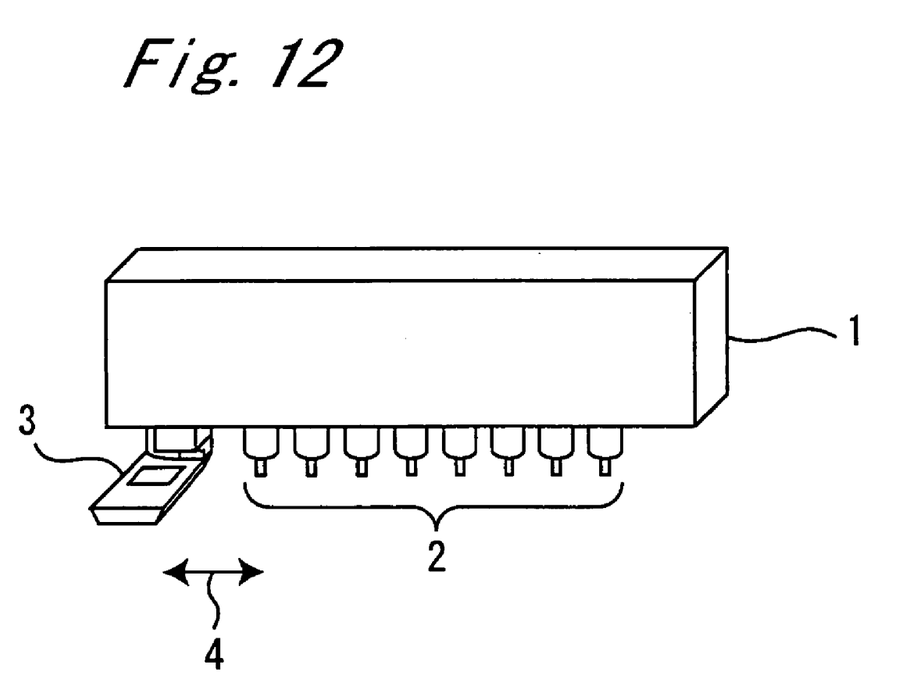
FIG. 12 is a diagram showing a configuration of a conventional working head in which a head camera is installed.

In FIG. 12 is shown a working head in which the head camera is installed. As shown in FIG. 12, the working head 1 has a plurality of component suction nozzles 2 and one head camera 3, which stands by at the left or right end of the working head 1, propels itself along array directions 4 of the component suction nozzles 2, and recognizes a suction status of electronic components held on the component suction nozzles 2. With this configuration, the suction status of the components can be inspected while the components are conveyed by the working head 1.

Flow from suction to mounting of components in the component mounting machine in which the head camera 3 is installed will be described with reference to a flowchart of FIG. 13. In a step S11, components are initially sucked by the working head 1 from component feeding sections. In a next step S12, a component fed in the step S11 is conveyed to a mounting position and recognition of the components by the head camera 3 is started. In a next step S13, whether recognition of the component that is to be mounted has been completed or not is determined on the basis of a status of the component recognition and, if not completed, standby in the mounting position lasts until the recognition of the object component is completed. In a next step S14, the component conveyed in the step S12 is mounted on the board. In a next step S15, a number of components held by the working head 1 is determined. Then the step S12 (except the component recognition, which has already been started), the step S13, and the step S14 are repeated until mounting of all the components is completed.

Figure 13:
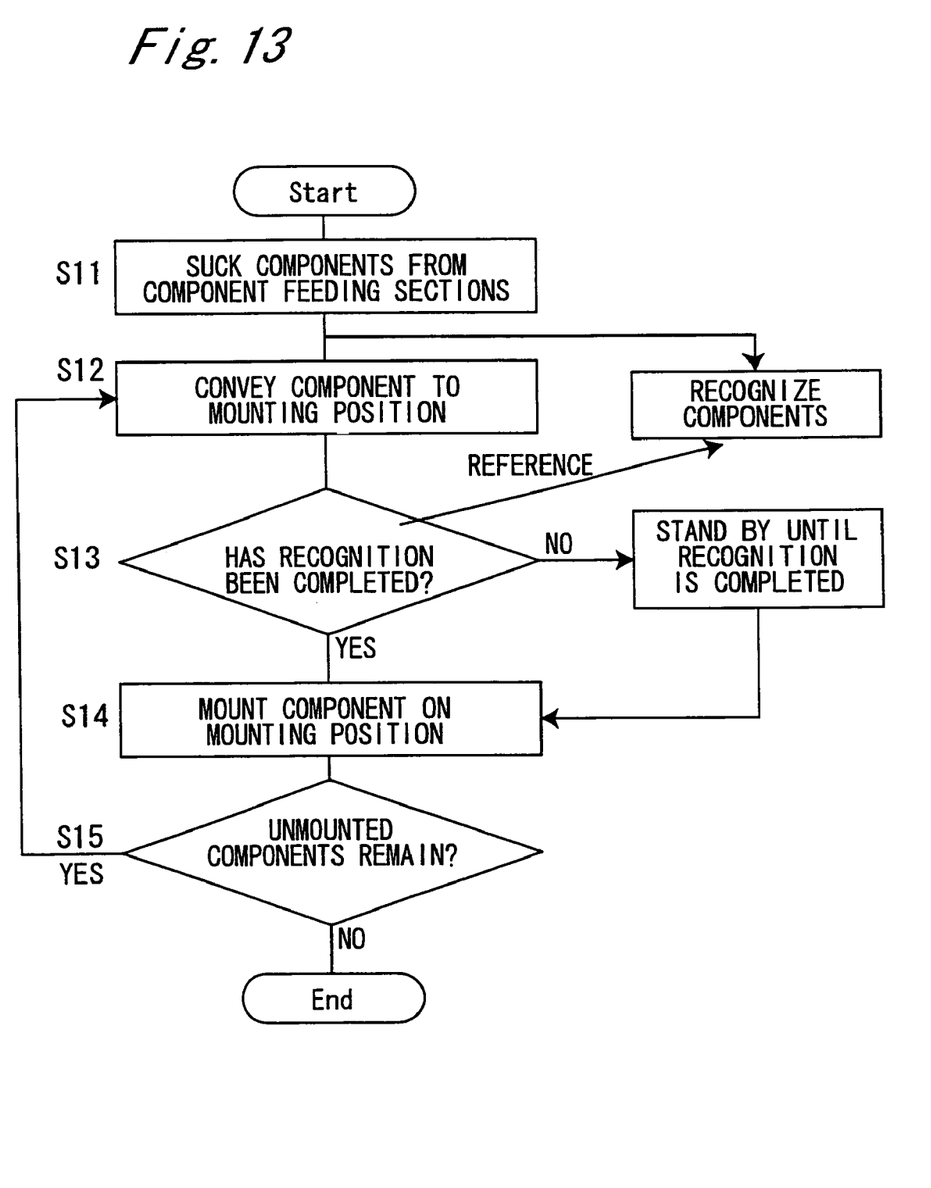
FIG. 13 is a flowchart showing a conventional component mounting procedure in a mounting machine in which a head camera is installed.

As is evident, particularly from the step S13 shown in FIG. 13, the operations are not independent of one another, and the mounting operation is influenced by the recognition operation. Accordingly, a component mounting sequence that minimizes a travel of the working head 1 is not necessarily an optimal mounting sequence.

Figure 14:
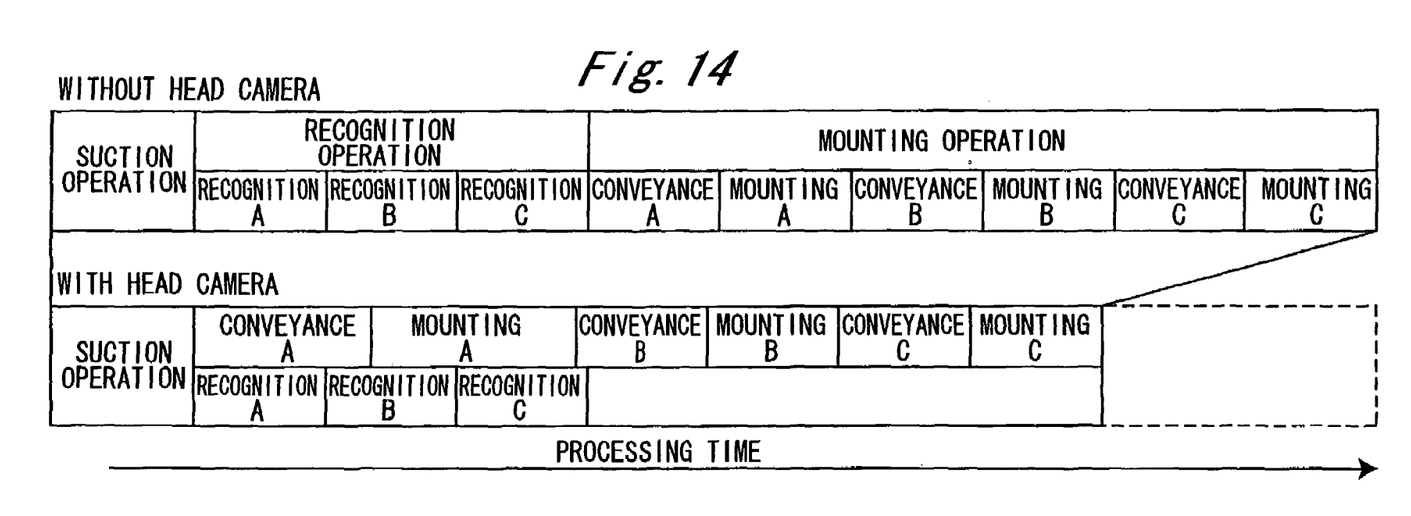
FIG. 14 is a diagram for illustrating influence a head camera exerts on processing time.

FIG. 14 shows a comparison of processing time between a component mounting machine in which the head camera 3 is installed and a component mounting machine in which the head camera 3 is not installed. Herein, characters "A," "B," and "C" represent components, "CONVEYANCE X" denotes a conveyance operation for a component X to a mounting position, "MOUNTING X" denotes a mounting operation for the component X, and "RECOGNITION X" denotes a recognition operation for the component X. The "X" denotes any of the "A", "B", and "C". The conveyance X and the recognition X are required to be completed before the component X is mounted. With use of the head camera 3, as shown in FIG. 14, recognition time for components can be removed from processing time, and thus the processing time can greatly be reduced.

Figure 15:
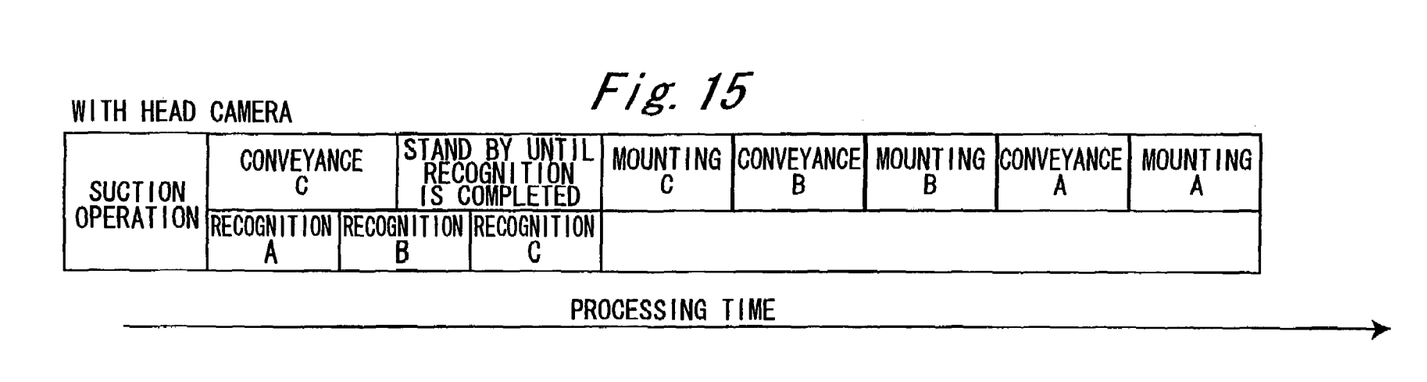
FIG. 15 is a diagram for illustrating influence component recognition time exerts on processing time.

If a mounting sequence of A→B→C is changed to a mounting sequence of C→B→A on the basis of a reason that a travel of the working head 1 following the latter sequence is shorter than a travel of the same following the former sequence, a given length of time is still required for the component recognition for the components A, B, and C though a length of time required for the conveyance of the component C is reduced as shown in FIG. 15. Accordingly, the working head 1 is obliged to postpone starting the mounting of the component C until the component recognition is completed. Such simple determination of the mounting sequence according to amount of travel of the working head 1 may result in worse processing time because of addition of recognition time to the processing time.

SUMMARY OF THE INVENTION

The present invention is intended for solving such problems of the conventional arts, and an object of the invention is to provide a component mounting sequence optimizing method by which cycle time for mounting can be reduced, in comparison with the conventional arts, in a component mounting device with a component holding head being capable of holding a plurality of components and having a component recognition camera; a component mounting device for executing the component mounting sequence optimizing method; a program for making a computer execute the component mounting sequence optimizing method; and a recording medium in which the program is recorded and which can be read by computers.

In order to accomplish the object, the invention is configured as follows.

According to a first aspect of the invention, a component mounting sequence optimizing method is provided in component mounting with use of a component holding head having a plurality of component holding members and a component image pickup section for capturing images of components held by the component holding members, the method comprising:

comparing conveyance times required for conveyances of components held by the component holding members to respective mounting positions with recognition times required for recognitions of the components held by the component holding members with the component image pickup section by using the a control device; and determining a mounting sequence for the components held by the component holding head by the control device on basis of a result of the comparison.

In the comparison operation, a mounting preparation time (T) that is the longer one in the conveyance time and the recognition time may be determined for every component, and a component having the shortest one in the mounting preparation times may be determined as a component that is to be subsequently mounted.

Before the comparison operation, mounting conditions required for mounting of the components may be determined by the control device.

A component mounting device according to a second aspect of the invention comprises:

a component holding head having a plurality of component holding members;

a component image pickup section configured to capture images of components held by the component holding members, wherein the components are held and mounted by the component holding head; and a control device configured to make comparison between conveyance times required for conveyances of the components held by the component holding members to respective mounting positions and recognition times required for recognitions of the components held by the component holding members with the component image pickup section and to determine a mounting sequence for the components held by the component holding head on basis of a result of the comparison.

In the component mounting device according to the second aspect, the control device may be configured so as to determine the mounting preparation time (T) that is the longer one in the conveyance time and the recognition time, for every component in the comparison operation, and so as to determine a component having the shortest one in the mounting preparation times as a component that is to be subsequently mounted.

In the component mounting device according to the second aspect, the control device may be configured so as to determine mounting conditions required for mounting of the components.

According to a third aspect of the invention, a program is provided for making a computer execute a component mounting sequence optimizing method in component mounting with use of a component holding head having a plurality of component holding members and a component image pickup section for capturing images of components held by the component holding members, the program comprising:

a procedure of making a comparison between conveyance times required for conveyances of the components held by the component holding members to respective mounting positions and recognition times required for recognitions of the components held by the component holding members with the component image pickup section; and a procedure of determining a mounting sequence for the components held by the component holding head on basis of a result of the comparison.

A recording medium which can be read by computers, according to a fourth aspect of the invention, is a recording medium in which a program is recorded for making a computer execute a component mounting sequence optimizing method in component mounting with use of a component holding head having a plurality of component holding members and a component image pickup section for capturing images of components held by the component holding members and which can be read by computers, wherein the program comprises:

a procedure of making comparison between conveyance times required for conveyances of the components held by the component holding members to respective mounting positions and recognition times required for recognitions of the components held by the component holding members with the component image pickup section; and a procedure of determining a mounting sequence for the components held by the component holding head on basis of a result of the comparison.

In accordance with the component mounting sequence optimizing method according to the first aspect of the invention, the component mounting device according to the second aspect, the program for executing the component mounting sequence optimizing method, according to the third aspect, and the recording medium in which the program is recorded, according to the fourth aspect, as described above, the comparison is made between the conveyance time for each component and the recognition time required for recognition of each component, and the mounting sequence for the components is determined on basis of a result of the comparison. Thus the mounting sequence is determined in additional consideration of the recognition time, and therefore cycle time for mounting can be reduced, in comparison with the conventional arts, in mounting of components with the component holding head having the plurality of component holding members and having the component image pickup section.

BRIEF DESCRIPTION OF THE DRAWINGS

These and other objects and features of the invention will be apparent from the following description concerning preferred embodiments with reference to the accompanying drawings, in which.

DETAILED DESCRIPTION OF THE INVENTION

With reference to the accompanying drawings, description will be given below concerning embodiments of the present invention, i.e., a component mounting sequence optimizing method, a component mounting device for executing the component mounting sequence optimizing method, a program for making a computer execute the component mounting sequence optimizing method, and a recording medium in which the program is recorded and which can be read by computers. It is to be noted that like parts are designated by like reference characters throughout the accompanying drawings. In the embodiments, "electronic components" are used as an example of "components"; however, the components are not limited to the electronic components. There may be used any components other than electronic components as long as the components can be mounted on boards, except for optical components, for example.

Figure 1:
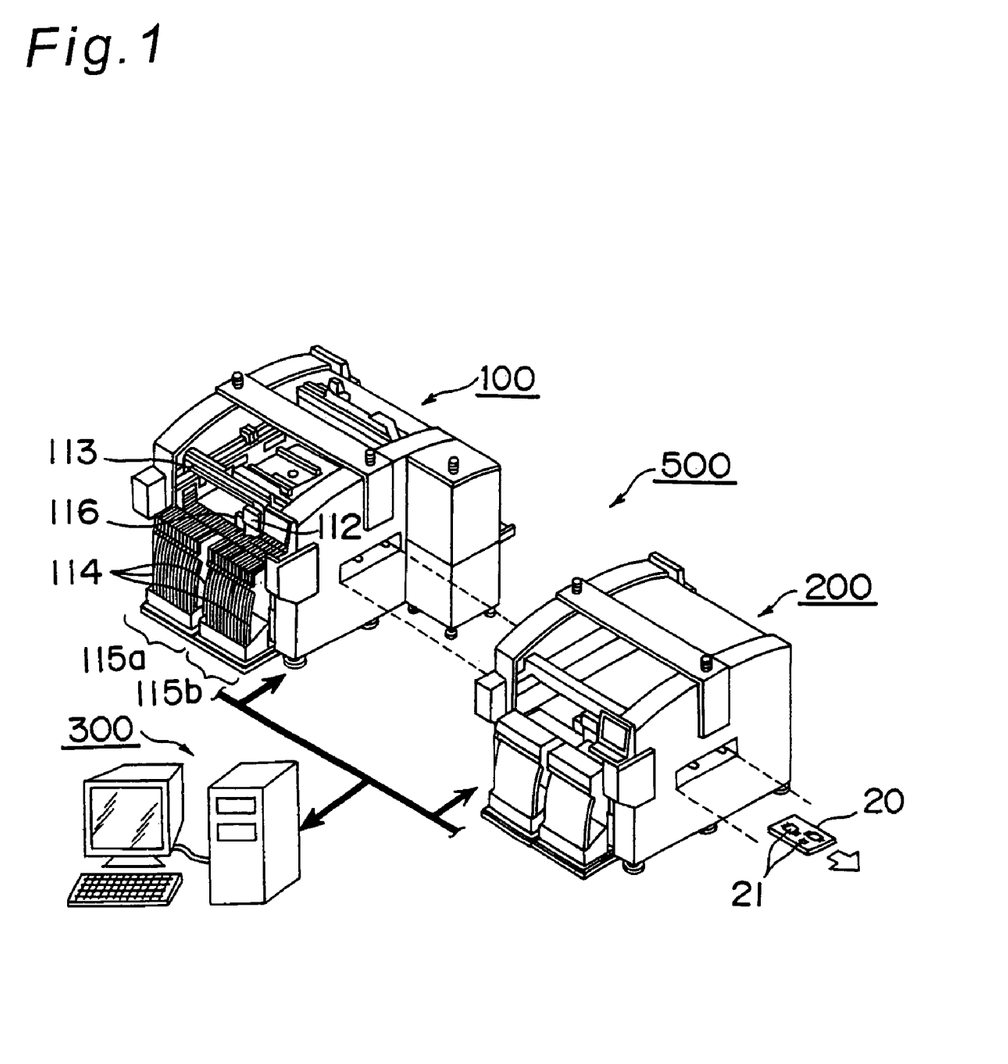
FIG. 1 is a perspective view showing a configuration of a component mounting system having a component mounting device of an embodiment of the invention.

FIG. 1 is a diagram illustrating a general configuration of an electronic component mounting system 500 having the component mounting device. The electronic component mounting system 500 has a plurality of component mounting devices 100, 200 composing a production line in which electronic components are mounted on circuit boards 20 being conveyed from an upstream side toward a downstream side, and has a component mounting sequence optimizing device 300 that optimizes a mounting sequence for electronic components required on the basis of various kinds of data at the beginning of production or the like, that downloads mounting data which is obtained by the optimization into the component mounting devices 100, 200, and that thereby adjusts and controls the devices.

Though FIG. 1 shows the electronic component mounting system 500 having a plurality of component mounting devices, the system may be composed of one component mounting device 100. In this arrangement, the component mounting sequence optimizing device 300 may be configured as a control device included in the component mounting device 100.

The component mounting sequence optimizing device 300 is composed of a general-purpose computer system such as a personal computer that executes the mounting sequence optimizing program of the embodiment. The component mounting sequence optimizing device 300 in stand-alone status in which the device is not connected to the component mounting device 100 and the like can be made to function as an optimization simulator for component mounting sequence.

Figure 8:
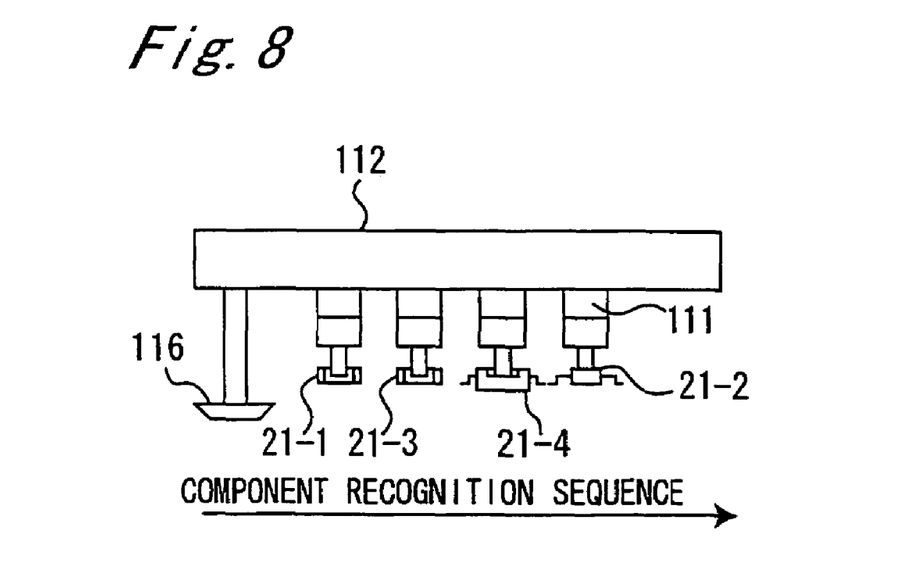
FIG. 8 is a diagram for illustrating the method of selecting a next mounting point in the mounting sequence determining method shown in FIG. 6.

The component mounting device 100 has component feeding sections 115a, 115b composed of arrays of so-called component cassettes 114 that contain components in tapes wound on reels and draw out the tapes to feed the components, a component holding head 112 that sucks a plurality of electronic components from the component feeding sections 115a, 115b in one component holding step and mounts the components on the circuit board, and an XY-robot 113 that moves the component holding head 112 in X and Y-directions. As shown in FIG. 8, the component holding head 112 has a plurality of nozzles 111 as component holding members, is capable of holding electronic components by the nozzles 111 in one component holding step, and has a component recognition camera 116 that is provided on the component holding head 112 and that travels by itself to capture images of holding status of the components held by the nozzles 111. The component recognition camera 116 corresponds to one of examples of the component image pickup sections.

Figure 2:
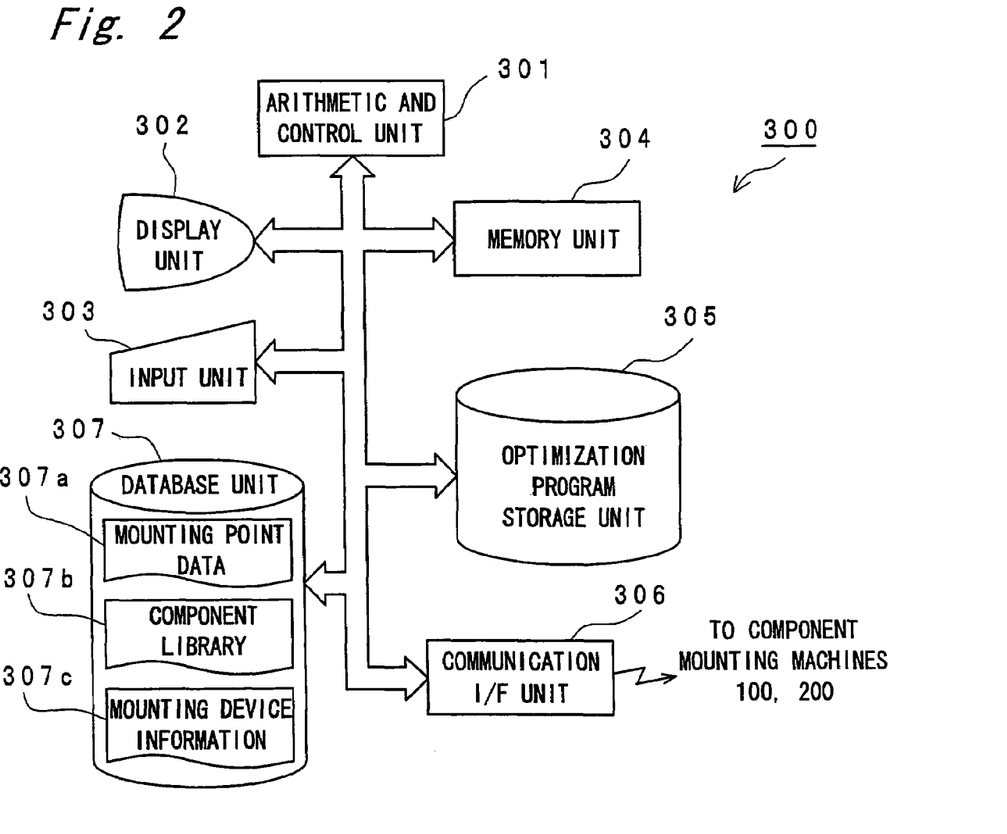
FIG. 2 is a functional block diagram of a component mounting sequence optimizing device shown in FIG. 1.

FIG. 2 is a functional block diagram showing a configuration of the component mounting sequence optimizing device 300 shown in FIG. 1. The component mounting sequence optimizing device 300 is a computer equipment that determines components to be mounted at sub-facilities included in the production line and mounting sequences for the components at the sub-facilities so as to minimize line-processing times at the sub-facilities which correspond to maximum times of cycle times at the sub-facilities, thereby generating optimal mounting data. The component mounting sequence optimizing device 300 is composed of an arithmetic and control unit 301, a display unit 302, an input unit 303, a memory unit 304, an optimization program storage unit 305, a communication interface (I/F) unit 306, a database unit 307, and the like.

The arithmetic and control unit 301, which is a CPU, a numerical data processor or the like, loads a required program from the optimization program storage unit 305 into the memory unit 304 to execute the program in accordance with an instruction or the like from a user, and controls the component units 302 to 307 on basis of a result of the execution of the program.

The display unit 302 has a CRT, an LCD or the like. The input unit 303 has a keyboard, a mouse or the like. Both of the units are used for interaction between the optimizing device 300 and an operator, and the like, under control of the arithmetic and control unit 301. A specific user interface will be explained in relation to an example of display on a screen that will be described later.

The communication I/F unit 306, which is a LAN adaptor or the like, is used for interaction between the optimizing device 300 and the component mounting devices 100, 200, and the like.

The memory unit 304 is a RAM or the like that provides work areas for the arithmetic and control unit 301. The optimization program storage unit 305 is a hard disk or the like that stores a variety of optimization programs for achieving functions of the optimizing device 300.

The database unit 307 is a hard disk or the like storing mounting point data 307a, component library 307b, and component mounting device information 307c that are input data for use in the optimization processing by the optimizing device 300 and storing mounting point data and the like that are produced by the optimization.

Figure 3:
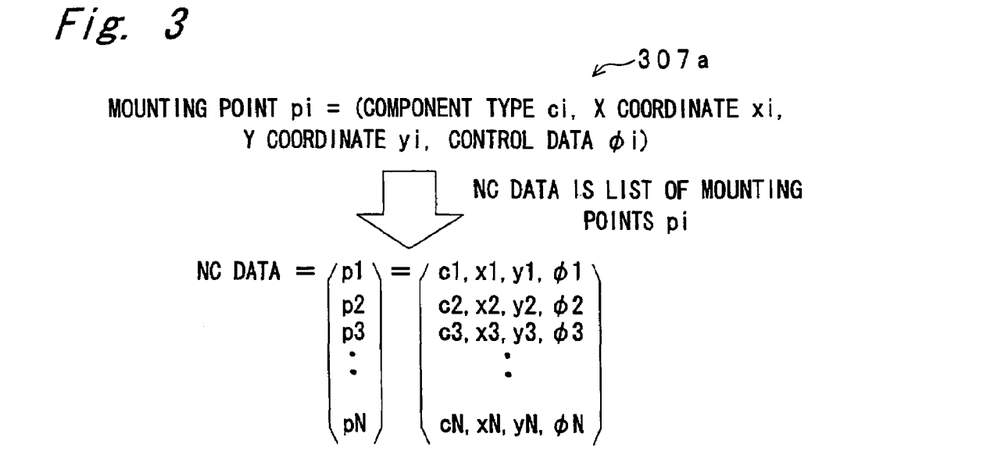
FIG. 3 is a diagram showing an example of mounting point data that is stored in the component mounting sequence optimizing device shown in FIG. 1.
Figure 4:
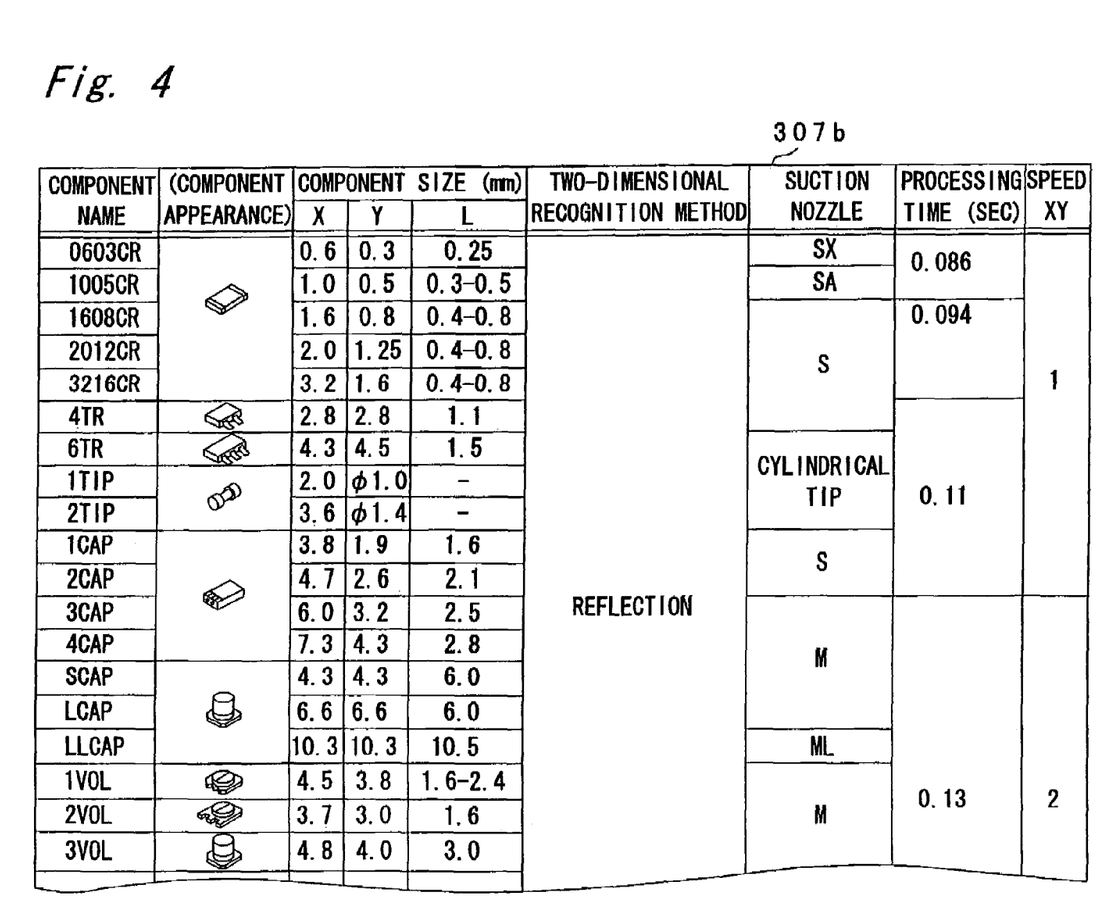
FIG. 4 is a diagram showing an example of component library that is stored in the component mounting sequence optimizing device shown in FIG. 1.

FIG. 3 and FIG. 4 show examples of the mounting point data 307a and the component library 307b, respectively. The mounting point data 307a is a collection of items of information designating the mounting points of all the components that are to be mounted. As shown in FIG. 3, one mounting point pi is composed of a component type ci, an X-coordinate xi, a Y-coordinate yi, and control data φi. Herein, the "component type" corresponds to a "component name" in the component library 307b shown in FIG. 4, the "X-coordinate" and "Y-coordinate" are coordinates of mounting points, that is, coordinates designating specific positions on the board, and the "control data" is constraint information on mounting of the component, that is, information such as a type of suction nozzle 111 that can be used for mounting the component and a maximum traveling speed of the component holding head 112. NC data that is to be ultimately obtained is formed with an arrangement or sequence of mounting points that minimizes the line-processing time.

The component library 307b is a library that contains information inherent in each of all the component types which can be handled by the component mounting devices 100, 200, and is composed of constraint information such as component size, processing time inherent in a pertinent component type under a given condition, type of suction nozzle 111 that can be used, and maximum speed ratio of the component holding head 112 for every component type, as shown in FIG. 4.

Figure 5:
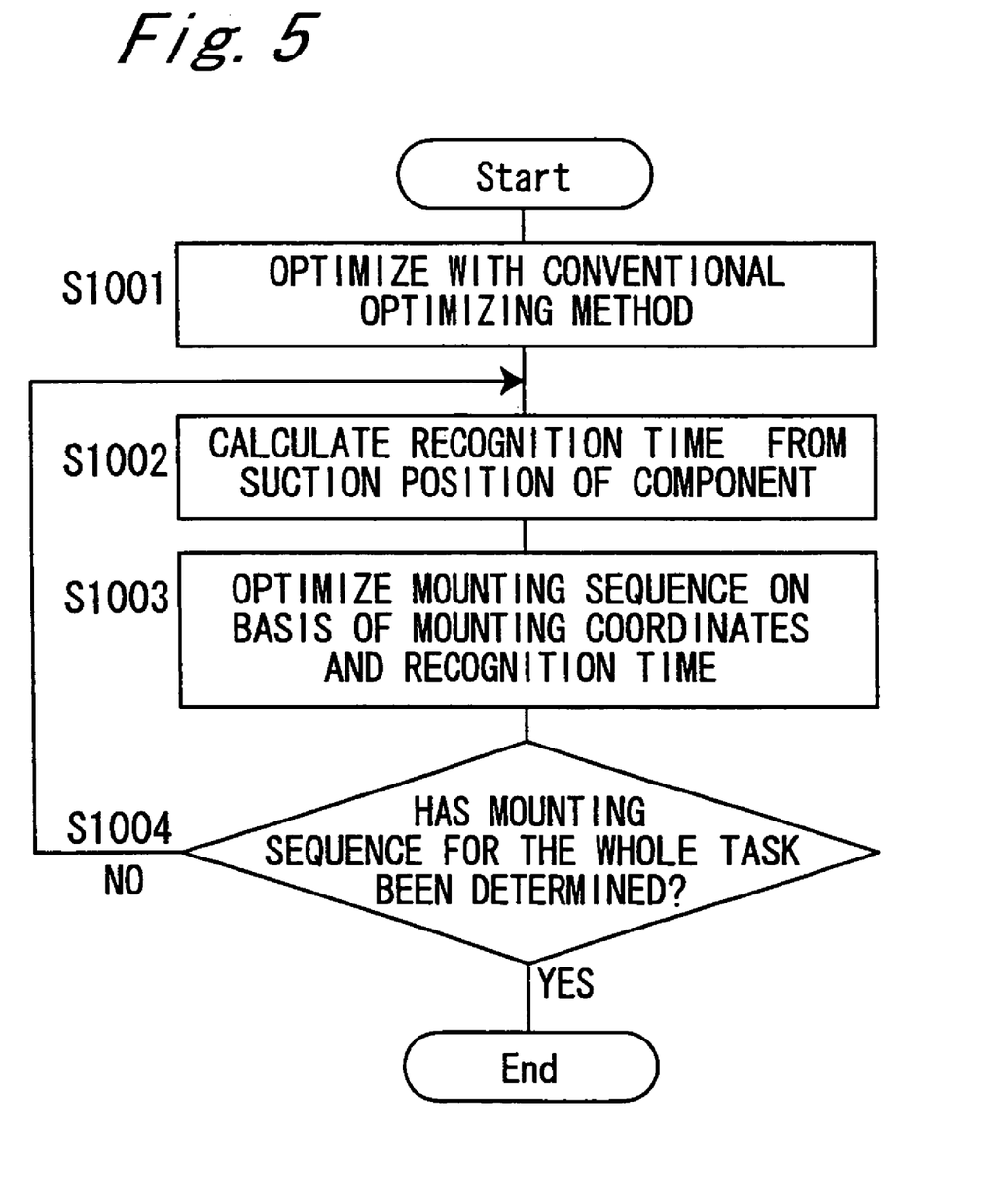
FIG. 5 is a flowchart showing operations of a component mounting sequence optimizing method in accordance with an embodiment of the invention that is executed in the component mounting sequence optimizing device shown in FIG. 1.

Operations in the component mounting sequence optimizing device 300 configured as described above, that is, the component mounting sequence optimizing method of the embodiment will be described below with reference to a flowchart of FIG. 5.

In a step S1001, optimization with a conventional optimizing method is executed for all components that are to be mounted on the board. When one task means a series of operations from suction of components at a time from the component feeding sections 115a, 115b through subsequent movement of the component holding head 112 to mounting of all the sucked components, a plurality of tasks are executed until one board 20 is completed. For every task, the components to be mounted and mounting conditions required for mounting of the components on the board 20 are determined in the operations of the step 1001. The mounting conditions include execution sequence in each operation, choice of the nozzles 111 that are to suck the components, arrangement of component cassettes 114 in the component feeding sections 115a, 115b and the like.

In a step S1002, recognition time for each component in one task is determined on the basis of a position of the suction nozzle 111 that sucks the component and that has been determined in the step S1001 and a standby position of the component recognition camera 116. That is, since a traveling speed of the component recognition camera 116 is fixed, the recognition time required for the image capture can be determined for each component on the basis of a relative position between the component sucked by the nozzle 111 and the component recognition camera 116.

In a step S1003, component mounting sequence is optimized on basis of the mounting point coordinates of the components to be mounted in the one task that have been determined in the step S1001 and the recognition time for each component that has been determined in the step S1002. Details of the step will be described later.

In a step S1004, whether or not the mounting sequences for the whole task have been determined is determined, and the steps S1002 and S1003 are repeated until the mounting sequences for the whole task are determined.

Figure 6:
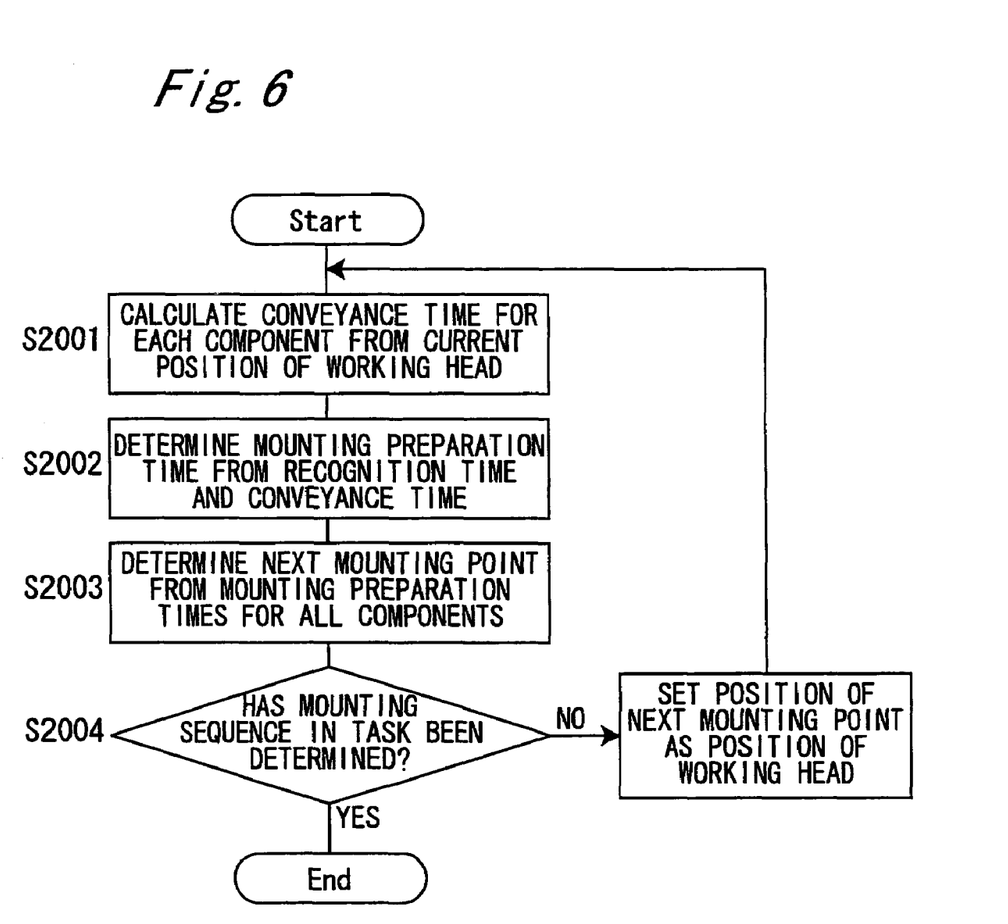
FIG. 6 is a flowchart for illustrating a procedure for determining a component mounting sequence shown in FIG. 5.

The mounting sequence optimizing method in the step S1003 will be described below with reference to a flowchart of FIG. 6.

In a step S2001 are separately determined lengths of time that are required for conveyance of the components from a current position of the component holding head 112 to respective mounting positions after the nozzles 111 of the component holding head 112 finish holding the components required for the mounting. The current position of the component holding head 112 means that in an initial state, the position is a position at a time when the suction of the components from the component feeding sections 115a, 115*b* is completed; in other states, the position is a mounting position for each component. The conveyance time for each component can be determined from a relative coordinate between the current position of the component holding head 112 and the mounting position for each component. The conveyance time is a length of time that is required for movement of the component holding head 112 from the current position to the mounting position, and does not include a length of time that is required for mounting of the component after arrival at the mounting position.

In a step S2002, comparison is made between the conveyance time for each component that has been determined in the step S2001 and the recognition time for each component that has been determined in the step S1002, and the longer one is set as a mounting preparation time T for each component.

In a step S2003, comparison is made among the mounting preparation time T for each component that have been determined in the step S2002, and a component having the shortest mounting preparation time T is determined as a component that is to be subsequently mounted.

In a step S2004, a decision is made whether or not a mounting sequence for all the components in one task has been determined. If there exist components for which a mounting sequence has not been determined, the mounting coordinate of the component to be subsequently mounted that has been determined in the step S2003 is used as the current position of the component holding head 112 and the steps S2001, S2002, and S2003 are repeated.

Hereinbelow, the component mounting sequence optimizing method in the step S1003 will be described in detail with use of a specific example.

It is assumed that components 21-1, 21-2, 21-3, and 21-4 which are to be mounted in a task and nozzles 111 which are to suck the components 21-1 to 21-4 have been determined in the step S1001. It is also assumed that lengths of the recognition time from initiation of conveyance of the components to completion of recognition of the components have been determined as TP1, TP2, TP3, and TP4, respectively, in the step 1002. Under the above conditions, the component mounting sequence is optimized in the step S1003.

Figure 7:
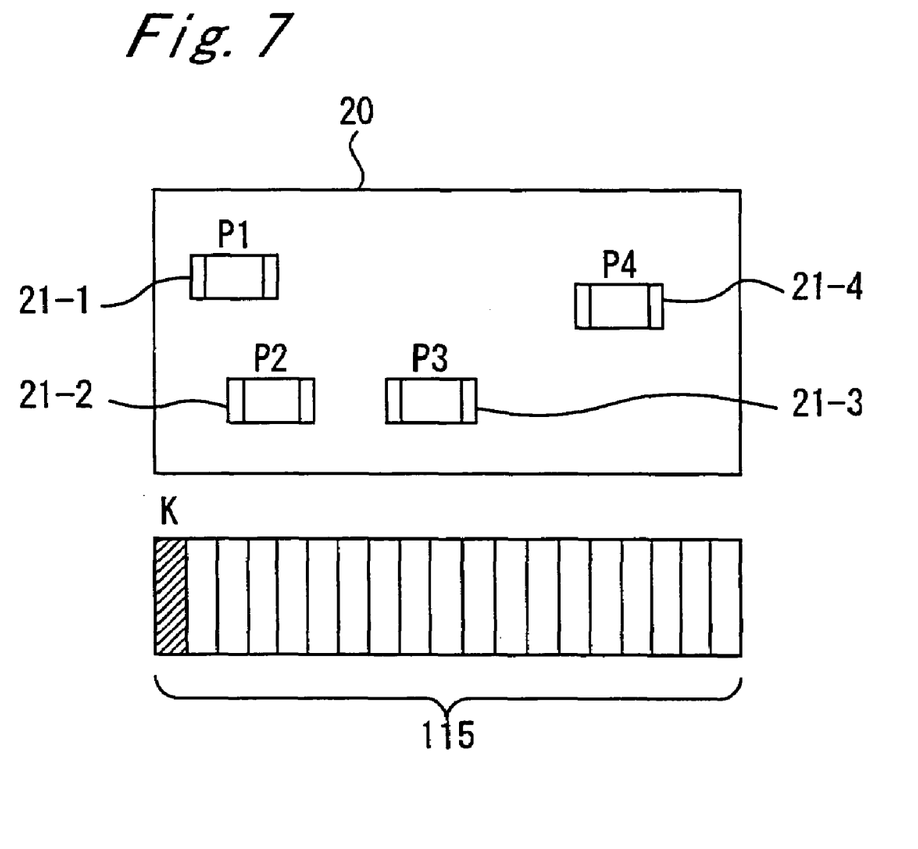
FIG. 7 is a diagram for illustrating a method of selecting a next mounting point in the mounting sequence determining method shown in FIG. 6.

FIG. 7 shows a relation among the mounting coordinates of the components and mounting positions (P1 to P4) on a board of the components held by the suction nozzles 111 of the component holding head 112. FIG. 8 shows a standby position of the component recognition camera 116. In FIG. 7, a reference character K denotes a conveyance starting position of the component holding head 112, that is, a position of the component holding head 112 on occasion of completion of component suction in a current task, and characters P1 to P4 for the components 21 on the circuit board 20 denote mounting locations (mounting coordinates) for the components 21.

Figure 9:
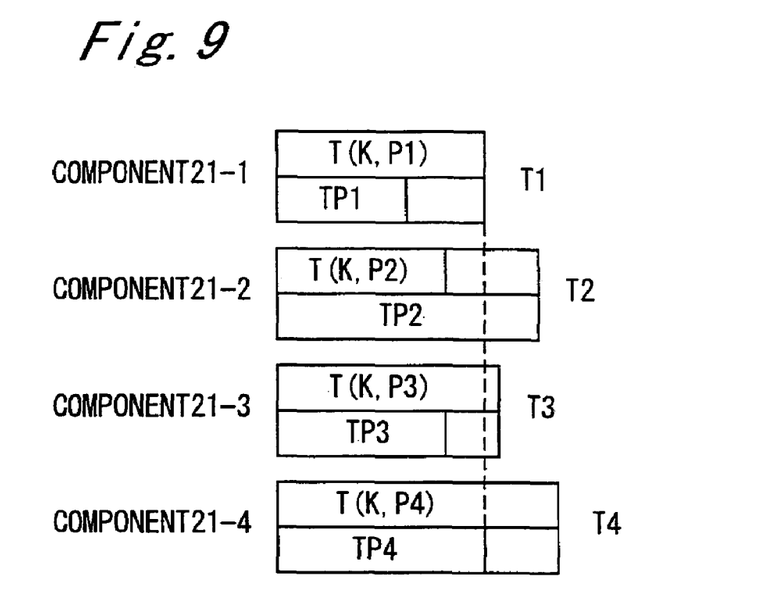
FIG. 9 is a diagram for illustrating the method of selecting a next mounting point in the mounting sequence determining method shown in FIG. 6.

Initially, a component that is to be mounted first is determined on basis of the conveyance starting position K of the component holding head 112 and the mounting coordinates P1 to P4 for the components 21. Before mounting of the component, both conveyance of the component to the mounting coordinate and recognition of the component have to be completed. Therefore, comparisons are made between the conveyance times from the conveyance starting position K to the mounting coordinates P1 to P4 for the components 21 and the recognition times determined in the step S1002 for the components 21, and the longer ones are set as the mounting preparation times T for the components 21. The conveyance times to the mounting coordinates P1 to P4 for the components 21 can be determined on the basis of the traveling speed of the component holding head 112 and the relative coordinates between the conveyance starting position K and the mounting locations P1 to P4 for the components 21. The lengths of the conveyance time from the conveyance starting position K to the mounting locations P1 to P4 for the components 21 are represented as T(K, P1), T(K, P2), T(K, P3), and T(K, P4), respectively. Then comparisons are made among the mounting preparation times T1 to T4 for the components 21 as shown in FIG. 9, and a component with the shortest mounting preparation time T, that is, a component that can be mounted in the shortest time is determined as a component that is to be subsequently mounted. In the example described above, the mounting preparation time T for the component 21-1 is the shortest as shown in FIG. 9, and the component 21-1 is therefore determined as a component that is to be subsequently mounted. Then the mounting position P1 of the component 21-1 is determined as a first mounting point.

After that, a second mounting component that is to be secondly mounted is determined on the basis of the first mounting point P1 and the mounting coordinates P2 to P4 for other components 21-2 to 21-4. Lengths of new conveyance time from the first mounting point P1 to the mounting coordinates P2 to P4 for the remainder components 21 are represented as T(P1, P2), T(P1, P3), and T(P1, P4), respectively. In a manner similar to the determination of the first mounting point P1 described above, comparisons are made between the new conveyance times required for movements of the component holding head 112 from the first mounting point P1 to the mounting coordinates P2 to P4 and recognition times. However, since the component 21-1 has already been mounted on the mounting point P1 at this point, therefore the comparisons are made between total times and the recognition times determined in the step S1002. The total times are times that the new conveyance times from the first mounting point P1 to the mounting coordinates P2 to P4, the conveyance time T(K, P1) from the conveyance starting position to the mounting point P1, and mounting time TM1 required for the mounting of the component 21-1 on the mounting point P1 are totalized. Thus lengths of new mounting preparation times T2(2) to T4(2) for the components 21-2 to 21-4 are determined.

Figure 10:
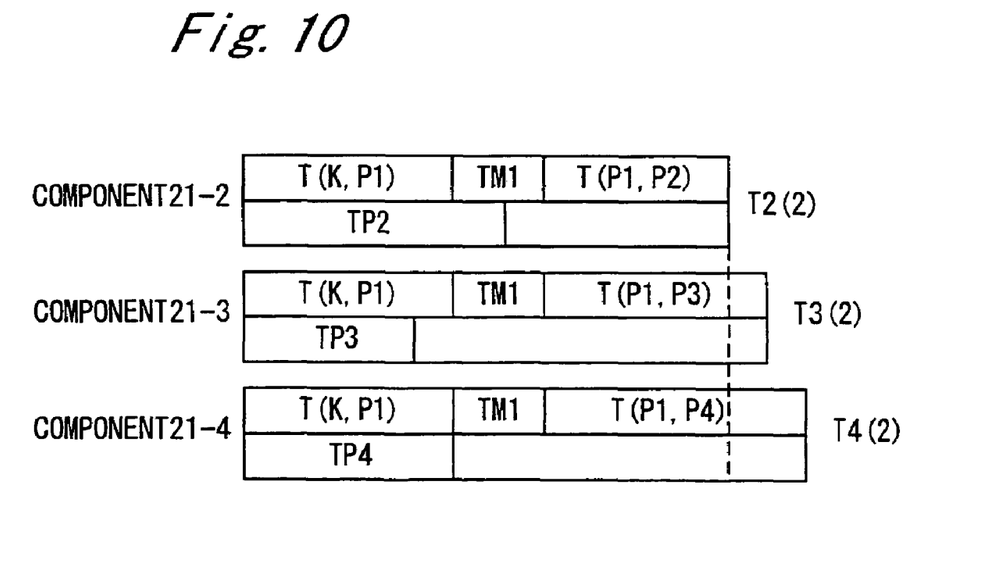
FIG. 10 is a diagram for illustrating the method of selecting a next mounting point in the mounting sequence determining method shown in FIG. 6.

Subsequently, comparisons are made among the new mounting preparation times T2(2) to T4(2) for the components 21-2 to 21-4 as shown in FIG. 10, and a component having the shortest time is determined as a component that is to be subsequently mounted. In this example, the mounting preparation time T2(2) for the component 21-2 is the shortest as shown in FIG. 10, the component 21-2 is therefore determined as a component that is to be secondly mounted, and the mounting coordinate thereof is P2.

The above operations are repeated until mounting sequence for all the components in the task is determined, and thus the mounting sequence for the components in the task is determined.

In accordance with the component mounting sequence optimizing method of the embodiment, as described above, not only distances between the components, that is, the conveyance times but also the recognition times can be taken into consideration, and thus there can be executed optimization of component mounting sequence that is suitable for the component mounting device in which the component recognition camera 116 allowing simultaneous performance of the conveyance and recognition of the components is installed.

Appropriate combinations of arbitrary embodiments out of the various embodiments described above are capable of achieving the effects the combined embodiments have.

The invention has fully been described with respect to the preferred embodiments in reference to the accompanying drawings; however, various changes and modifications are apparent to those skilled in the art. It is to be understood that such changes and modifications are embraced by the scope of the invention unless departing from the scope of the invention as defined in the appended claims.

The invention claimed is:

1. A component mounting sequence optimizing method in component mounting with use of a component holding head, the component holding head having a plurality of component holding members and a component image pickup section for capturing images of components held by the component holding members, wherein the component image pickup section is operable to move along an array of the component holding members, the component mounting sequence optimizing method comprising:

determining, for each of the components held by the components holding members, a mounting preparation time on a basis of a conveyance time required for conveyance of the component to a mounting position and a recognition time required for recognition of the component by the component image pickup section;

comparing the determined mounting preparation times for the components held by the component holding members; and determining a mounting sequence for the components held by the component holding members on a basis of a result of said comparing.

2. The component mounting sequence optimizing method as claimed in claim 1, wherein, for each of the components held by the component holding members, the mounting preparation time is determined as the longer of the conveyance time and the recognition time; and wherein the component mounting sequence optimizing method further comprises determining a component having the shortest of the mounting preparation times as a component that is to be subsequently mounted.

3. The component mounting sequence optimizing method as claimed in claim 1, further comprising determining mounting conditions required for mounting of the components, wherein said determining of mounting conditions is performed prior to said determining of mounting preparation times.

4. A component mounting device comprising:

a component holding head having a plurality of component holding members and a component image pickup section, wherein the component image pickup section is configured to capture images of components held by the component holding members, and wherein the component image pickup section is operable to move along an array of the component holding members; and a control device operable to, for each of the components held by the component holding members, determine a mounting preparation time on a basis of a conveyance time required for conveyance of the component to a mounting position and a recognition time required for recognition of the component by the component image pickup section; to compare the determined mounting preparation times for the components held by the component holding members; and to determine a mounting sequence for the components held by the component holding members on a basis of a result of the comparison of the determined mounting preparation times.

5. The component mounting device as claimed in claim 4, wherein, for each of the components held by the component holding members, the control device determines the mounting preparation time as the longer of the conveyance time and the recognition time, and wherein the control device determines a component having the shortest of the mounting preparation times as a component that is to be subsequently mounted.

6. The component mounting device as claimed in claim 4, wherein the control device further determines mounting conditions required for mounting of the components.

7. A recording medium which can be read by a computer and in which a program is recorded for causing the computer to execute a component mounting sequence optimizing method in component mounting with use of a component holding head, the components holding head including a plurality of component holding members and a component image pickup section for capturing images of components held by the component holding members, wherein the component image pickup section is operable to move along an array of the component holding members, and wherein the components mounting sequence optimizing method comprises:

determining, for each of the components held by the component holding members, a mounting preparation time on a basis of a conveyance time required for conveyance of the component to a mounting position and a recognition time required for recognition of the component by the component image pickup section; and comparing the determined mounting preparation times for the components held by the component holding members; and determining a mounting sequence for the components held by the component holding members on a basis of a result of said comparing.

8. The recording medium as claimed in claim 7, wherein, for each of the components held by the component holding members, the mounting preparation time is determined as the longer of the conveyance time and the recognition time; and wherein the component mounting sequence optimizing method further comprises determining a component having the shortest of the determined mounting preparation times as a component that is to be subsequently mounted.

9. The recording medium as claimed in claim 7, wherein the component mounting sequence optimizing method further comprises determining mounting conditions required for mounting of the components, wherein said determining of mounting conditions is performed prior to said determining of mounting preparation times.

* * * * *